(12) United States Patent
Kim

(10) Patent No.: US 6,294,482 B1
(45) Date of Patent: *Sep. 25, 2001

(54) METHOD OF FORMING AN INSULATING LAYER PATTERN IN A LIQUID CRYSTAL DISPLAY

(75) Inventor: Jung-Ha Kim, Seoul (KR)

(73) Assignee: LG LCD Inc., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 09/433,957

(22) Filed: Nov. 4, 1999

(30) Foreign Application Priority Data

Nov. 4, 1998 (KR) .................................................. 98-47185

(51) Int. Cl.⁷ ..................................................... B05D 3/06
(52) U.S. Cl. ......................... 438/770; 438/149; 438/151; 438/758; 438/771; 438/789; 438/790
(58) Field of Search .................................... 438/149, 151, 438/758, 771, 774, 770, 789, 790

(56) References Cited

U.S. PATENT DOCUMENTS 6,060,130 * 5/2000 Kim ..................................... 427/558

* cited by examiner

*Primary Examiner*—Charles Bowers
*Assistant Examiner*—Lisa Kilday

(57) ABSTRACT

A method of forming an insulating layer pattern in a liquid crystal display which enables the formation of an insulating layer pattern on a substrate under a low temperature without the need of expensive equipment and complicated processes, wherein the formation speed of the insulating layer is accelerated. The method includes the steps of forming an organic thin layer containing silicon on an insulated substrate, exposing the thin layer to a gaseous ambience including, oxygen, generating a plurality of oxygen radicals and silicon radicals by applying ultraviolet rays to the thin layer using a mask having a predetermined pattern, forming an insulating layer by reacting the silicon radicals with the oxygen radicals, and defining an insulating layer pattern by removing a portion of the thin layer free of the ultraviolet rays.

18 Claims, 9 Drawing Sheets

POLYSILOXANE CINNAMATE COPOLYMER

POLYSILOXANE CINNAMATE

POLY(DIMETHYLSILOXANE)

PHENYL SILANE

N-(TRIMETHYLSILYL) ACETAMIDE

TRIMETHYLSILYL ACETATE 1-(TRIMETHYLSILYL-METHYL)-UREA 1,4-BIS(TRIMETHYLSILYL)-BENZENE 1,4-RIS(TRIMETHYLSILYL)-1,3-BUTADIYNE

FIG.3

| BONDING TYPE | BONDING ENERGY (kjmol⁻¹) | BONDING TYPE | BONDING ENERGY (kjmol⁻¹) |
|---|---|---|---|
| C-H | 413.4 | O-O | 138.4 |
| C-C | 347.7 | Si-C | 451.5 |
| C-O | 351.5 | Si-H | ≤ 299.2 |
| C-N | 291.6 | Si-Si | 326.8±10 |
| O-H | 462.8 | O=O | 490.4 |

METHOD OF FORMING AN INSULATING LAYER PATTERN IN A LIQUID CRYSTAL DISPLAY

BACKGROUND OF THE INVENTION

1. Field of the Invention

The present invention relates to a method of forming an insulating layer pattern in a liquid crystal display which enables the establishment of an insulating layer pattern on a substrate under low temperature without the use of expensive equipment and complicated processes.

2. Discussion of Related Art

A process of fabricating a thin film transistor (hereinafter "TFT") in liquid crystal display (hereinafter "LCD") includes the steps of forming a gate insulating layer between a gate electrode and an active layer, an insulating interlayer, a passivation layer comprising a protection layer that covers the source/drain electrodes and the like. In the process, silicon oxide or silicon nitride is used for the gate insulating layer, insulating interlayer, and passivation layer.

Chemical vapor deposition(hereinafter abbreviated CVD) or thermal oxidation as a related art is preferably used for forming silicon oxide and silicon nitride as the insulation layer.

In CVD, a process chamber for maintaining a vacuum state is supplied with silicon gas in an ambient of nitrogen or oxygen, and a thin layer is formed on a substrate through decomposition and chemical reactions.

In thermal oxidation which is an open-tube reaction undertaken under atmospheric pressure without the vacuum state, silicon oxide as the insulation layer is formed by exposing silicon to oxygen gas at a high temperature of between 1000 and 1200°. Thus, an insulating layer of pure quality is formed having neither ionic impurities nor defects at an interface.

As mentioned in the above explanation, an insulating layer in LCD's according to a related art is formed by CVD or thermal oxidation. Unfortunately, the CVD method requires a complicated process and highly expensive equipment for maintaining a reaction chamber in a vacuum state. Also, the thermal oxidation method requires a high temperature for forming an insulating layer and exhibits a slow growing speed of formation.

SUMMARY OF THE INVENTION

Accordingly, the present invention is directed to a method of forming an insulating layer pattern in a liquid crystal display that substantially obviates one or more of the problems, limitations, and disadvantages of the related art.

Thus, an object of the present invention is to provide a method of forming an insulating layer in LCD's under low temperature and without the necessity of using expensive equipment. Additional features and advantages of the present invention will be set forth in the description which follows and in part will be apparent from the description, or may be learned by practice of the invention. The objectives and other advantages of the present invention will be realized and attained by the structure particularly pointed out in the written description and claims hereof as well as the appended drawings.

To achieve these and other advantages and in accordance with the purpose of the present invention, as embodied and broadly described, the present invention includes the steps of forming an organic thin layer containing silicon on an insulated substrate, exposing the thin layer to a gaseous ambience, including oxygen, applying ultraviolet rays to the thin layer using a mask which is defined with a predetermined pattern to generate a plurality of oxygen radicals and silicon radicals, forming an insulating layer by reacting the silicon radicals with the oxygen radicals, and defining an insulating layer pattern by removing a portion of the thin layer free of the ultraviolet rays.

In another aspect, the present invention includes the steps of forming an electrode on an insulated substrate, forming an organic thin layer covering the electrode on the insulated substrate wherein the organic thin layer contains silicon, exposing the thin layer to a gaseous ambience including oxygen, applying ultraviolet rays to the thin layer using a mask having a predetermined pattern to generate a plurality of oxygen radicals and silicon radicals, forming an insulating layer by reacting the oxygen radicals with the silicon radicals, and defining an insulating layer pattern by removing a portion of the thin layer free of the ultraviolet rays.

It is to be understood that both the foregoing general description and the following detailed description are exemplary and explanatory and are intended to limit the scope of the present invention.

BRIEF DESCRIPTION OF THE DRAWINGS

The accompanying drawings, which are included to provide a further understanding of the present invention and are incorporated in and constitute a part of the present application, illustrate embodiments of the invention and together with the description serve to explain the principle of the present invention, wherein:

FIG. 3 is a table showing the molecular bonding energy for various types of bonding in an organic thin layer structure containing silicon according to the present invention.

DETAILED DESCRIPTION OF PREFERRED EMBODIMENTS

Reference will now be made in detail to a preferred embodiment of the present invention, an example of which is illustrated in the accompanying drawings.

Figure 1A:
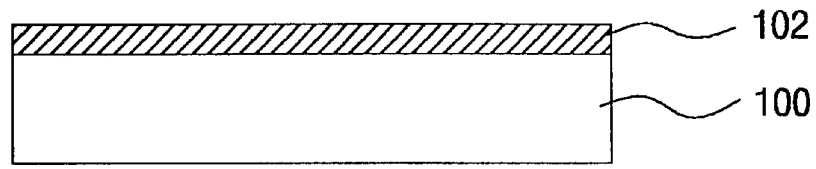
FIGS. 1A–1C show cross-sectional views of forming an insulating layer pattern by irradiation with ultraviolet rays according to the present invention.
Figures 1, 1B:
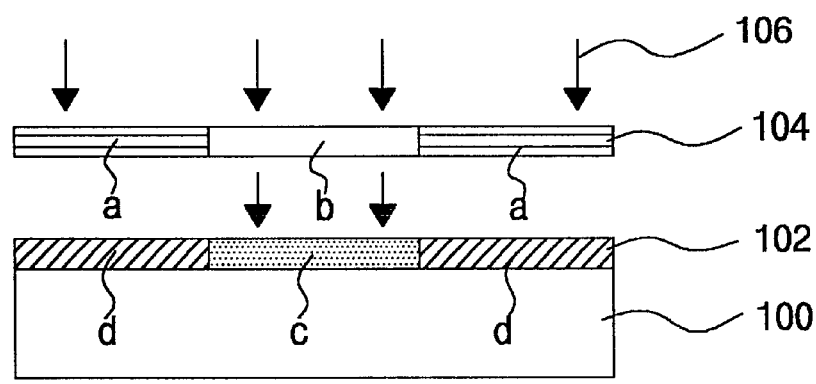
Figures 1, 1B, 2:
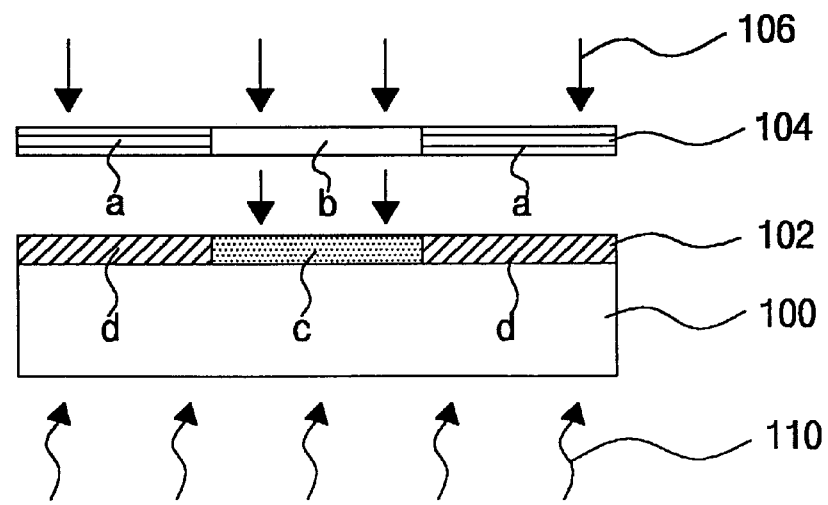
Figure 1C:
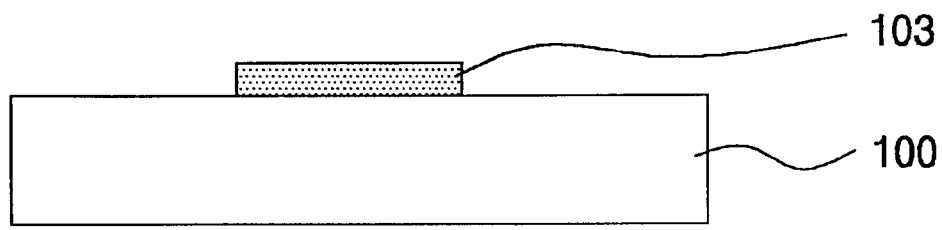

FIGS. 1A–1C show cross-sectional views of forming an insulating layer pattern by irradiation with ultraviolet rays according to the present invention.

Referring to FIG. 1A, an organic thin layer 102 is formed on an insulated substrate 100 of glass or the like by coating or low temperature CVD with an organic material containing silicon. In this case, the organic thin layer 102 is exposed to gaseous ambient conditions such as the atmosphere or oxygen.

The organic materials containing silicon, as shown in FIGS. 2A–2I, include polysiloxane cinnamate copolymer, polysiloxane cinnamate, poly (dimethylsiloxane), phenyl silane, N-(trimethylsilyl)acetamide, trimethylsilyl acetate, Trimethylsilyl acetate, 1-(trimethylsilyl-methyl)-urea, 1,4-bis(trimethylsilyl)-benzene, 1,4-bis(trimethylsilyl)-1,3-butadiene and the like.

FIGS. 2A–2I show the molecular structures of the various organic materials containing silicon according to the present invention.

Figure 2A:
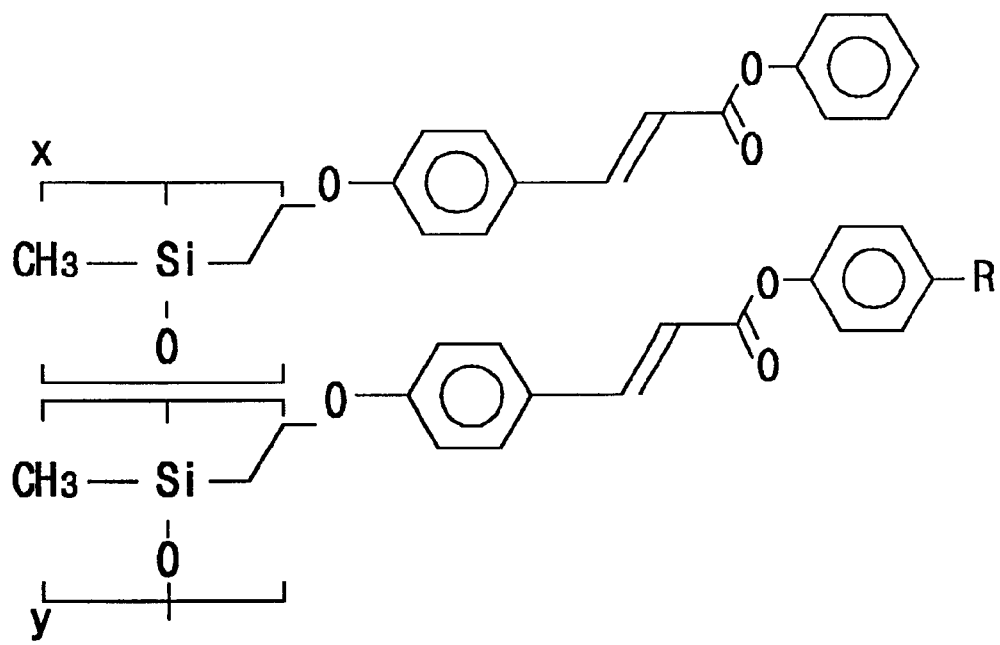
FIGS. 2A–2I show molecular structures of various organic material containing silicon according to the present invention.
Figure 2B:
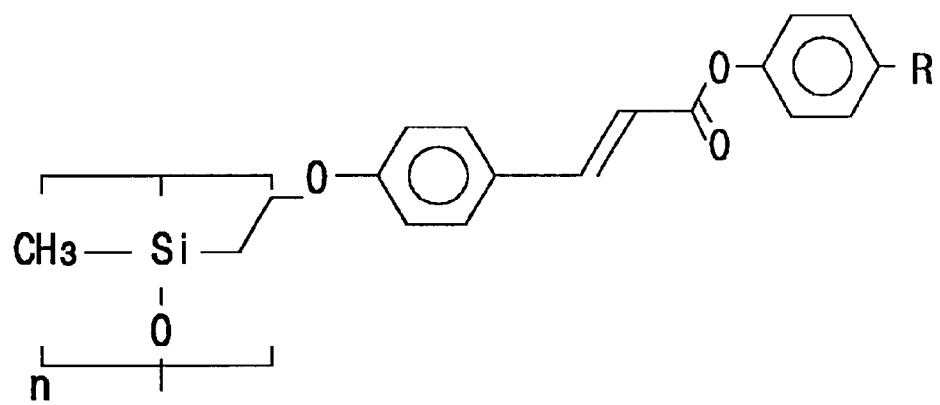
Figure 2C:
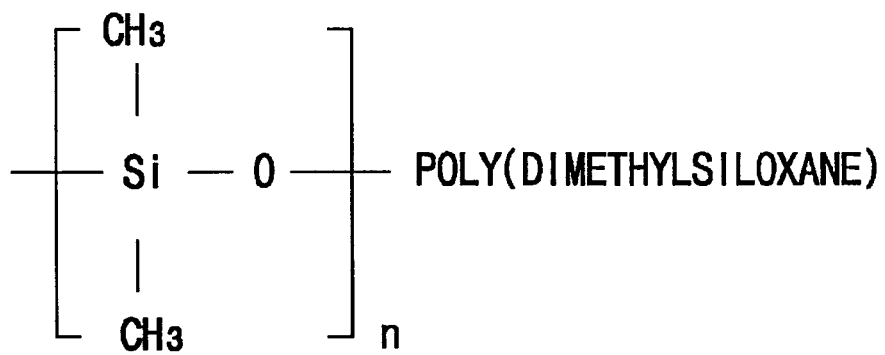
Figure 2D:
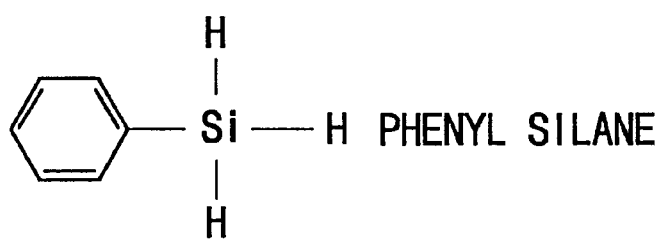
Figure 2E:
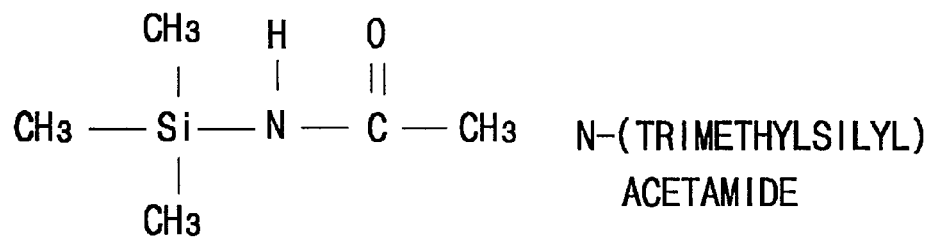
Figure 2F:
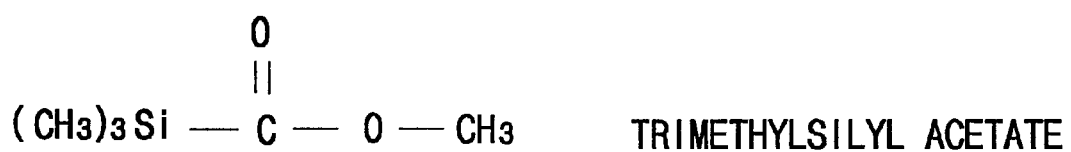
Figure 2G:
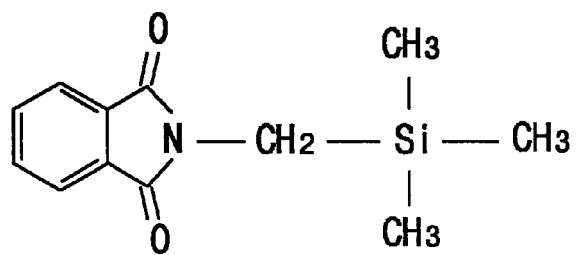
Figure 2H:
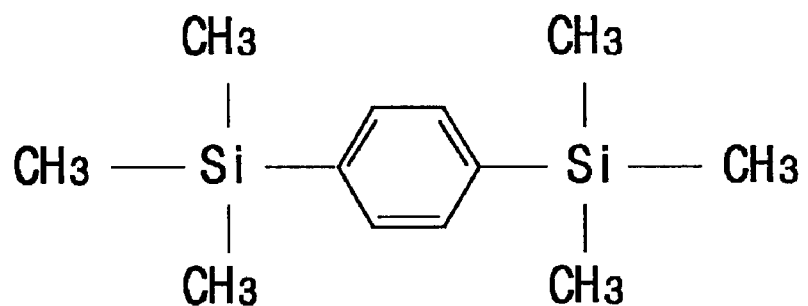
Figure 2I:
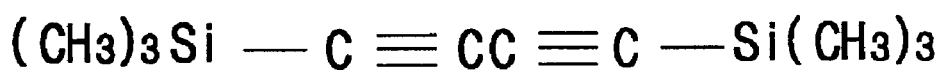

In FIGS. 2A, x and y are natural numbers which vary between 2 and 50, and n between 2 and 100. In FIGS. 2A and 2B, R is one of Cl, Br, I, CnH2m+1 where m is a natural number which ranges from 1 to 12, and —OC1H21+1 wherein 1 varies from 1 to 12, and the like. In FIG. 2B, n is a natural number.

The organic material containing silicon is combined with the silicon atoms in common and has a single bond or double bonds such as O—O, O=O, O—H, C—C , C—H, C—O, C=C, C=O, N—H, C—N and Si—O. The molecular bonding energy for each type of bond is shown in FIG. 3.

Referring to FIGS. 1B–1, ultraviolet rays 106 are applied to the organic thin layer 102 through a mask 104 having a predetermined pattern. The mask 104 is divided into two sections, i.e., a ray-penetrating region b and a ray-blocking region a.

Ultraviolet rays 106 having a wavelength under 210 nm are irradiated with a power over 30 Watt. During irradiation with ultraviolet rays, a certain amount of energy is released. Once the wave length is 210 nm, the released energy is 695 KJ/mol as calculated by using the formula (I).

$$E = Nh\nu = NhC/\lambda \tag{I}$$

wherein,

N=6.022×10E23 /mol wherein N is an Avogadro number,
h=6.626×10E-34 Js, wherein h is a Planck's constant,
C=2.998×10E8/ms, wherein C is the speed of light, and
$\mu$=210 nm, wherein $\lambda$ is the wavelength of light.

In this case, the energy released by ultraviolet irradiation should be larger than the molecular bond energy of the organic thin layer shown in FIG. 3. Namely, various kinds of radicals can be generated by cutting the bonds such as O—O, O=O, O—H, C—C, C—H, C—O, C=C, C=O, N—H, C—N, Si—O and the like, provided that the energy applied thereto is larger than the molecular bond energy of the organic thin layer 102.

This process is explained in the following description. Released by the irradiation of the ultraviolet rays 106, energy of 695 KJ/mol breaks down the oxygen molecular bond under a gaseous ambient state to generate oxygen radicals according to the formula (II).

$$O_2 = \rightarrow 2O\bullet \tag{II}$$

Moreover, in accordance with the following formula (II), various kinds of radicals including silicon radicals are generated from the break-down of molecular bonds in the ray-penetrating region b of the organic thin layer 102. In this case, the ray-blocking region d of the organic thin undergoes undergoes no change since the rays are unable to penetrate the mask at this location.

An organic thin film containing:

$$\text{silicon} \rightarrow C\bullet + H\bullet + O\bullet + Si\bullet + N\bullet \tag{III}$$

The radicals, such as C•, H•, O• and N•, resulting from formulas (II) and (III) follow the formula (IV) to become $CO_2$, $O_2$, $H_2O$, $N_2$, $NH_2$ gases due to reciprocal reactions. The molecules then evaporate into the air.

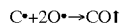

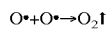

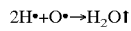

$$N\bullet + N\bullet \rightarrow N_2\uparrow \text{ or } N\bullet \rightarrow +3H\bullet \rightarrow NH_3\uparrow \tag{IV}$$

In this case, the radicals of O• and Si•, according to formula (V) react with each other to form an insulating layer of silicon oxide in the ray-penetrating region c of the organic thin layer 102. Silicon oxide which is non-volatile remains on the insulated substrate 100.

Referring to FIGS. 1B–2, when the ultraviolet rays 106 are irradiated, a thermal treatment 110 is also carried out simultaneously. Thus, the formation speed of the insulating layer on the ray-penetrating region c is accelerated in the organic thin layer 102.

The thermal treatment 110 is carried out by means of heat conduction with a heating plate or by means of air heated with an IR lamp.

Referring to FIG. 1C, an insulating layer pattern 103 is defined on the substrate 100 by removing the ray-blocking region d of the organic thin layer 102.

In LCD's, as a rule, TFT's are formed in a pixel aray with a driver for driving the pixel array. The TFT's are formed by forming and patterning a plurality of layers such as a gate insulating layer, an insulating interlayer, a passivation layer and the like.

Referring to FIGS. 4A–4G, an actual process of defining an insulating layer pattern is illustrated by applying the present invention to the fabrication of a coplanar typed transistor in an LCD.

Figure 4A:
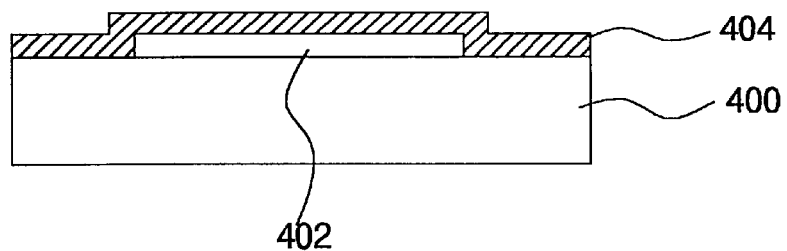
FIGS. 4A–4G show cross-sectional views of forming an insulating layer pattern in an LCD according to the present invention.
Figure 4B:
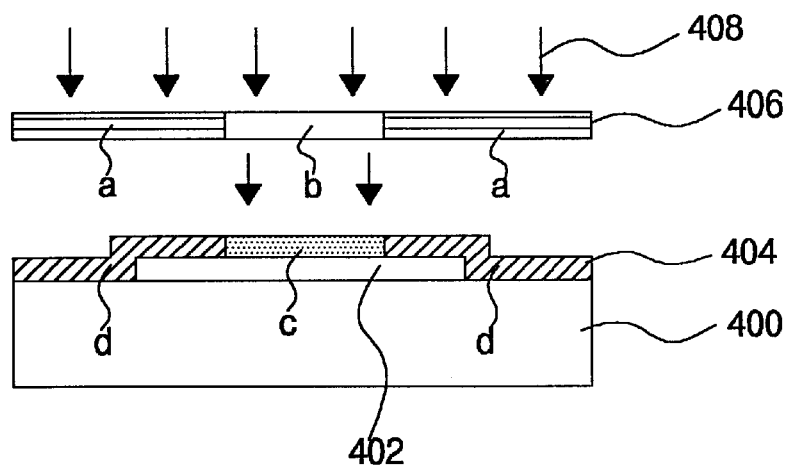

Referring to FIG. 4A, an active layer 402 is formed by depositing amorphous silicon on an insulated substrate 400 of glass or the like and by crystallizing the amorphous silicon by irradiating it with a laser beam. A first organic thin layer 404 is formed on the insulated substrate 400 to cover the active layer 402 by depositing thereon an organic material containing silicon as a coating or for low temperature deposition. Referring to FIGS. 4B, a first mask 406, where a ray-penetrating region b and a ray-blocking region a is defined, is prepared for forming a gate insulating layer.

The first organic thin layer 404 is irradiated with ultraviolet rays using the first mask 406. The ultraviolet ray irradiation 408 is carried out in an oxygen or atmospheric ambience wherein the ultraviolet rays have a wavelength under 210 nm and a power over 30 W.

In this case, a ray-penetrating region c of the first organic thin layer 404 is irradiated with ultraviolet rays through the ray-penetrating region b of the first mask 406.

Due to the energy generated from the ultraviolet ray irradiation, oxygen radicals are produced by breaking down the oxygen molecular bonds under a gaseous ambience and the molecular bonds in the ray-penetrated region c of the organic thin layer 404. Accordingly, silicon radicals are produced.

Accordingly, a first insulating layer of silicon oxide which is formed from the reciprocal reaction between the oxygen radicals and the silicon radicals is formed in the ray-penetrating region c of the first organic thin layer 404. The first insulating layer is to be used as a gate insulating layer. In this case, the formation speed of the first insulating layer is accelerated provided that a thermal treatment which is not shown in the drawing is utilized together with the ultraviolet ray irradiation 408.

Figure 4C:
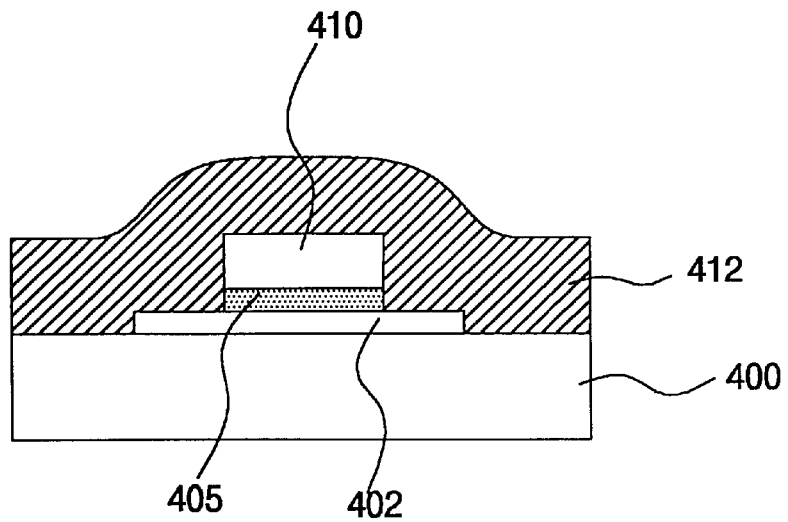

Referring to FIG. 4C, a gate insulating layer 405 is formed by removing the ray-blocked region d from the first organic thin layer. And, a gate electrode 410 is formed to remain on the gate insulating layer 405 of the insulated substrate 400. Then, a second organic thin layer 412 is formed on the above structure.

Figure 4D:
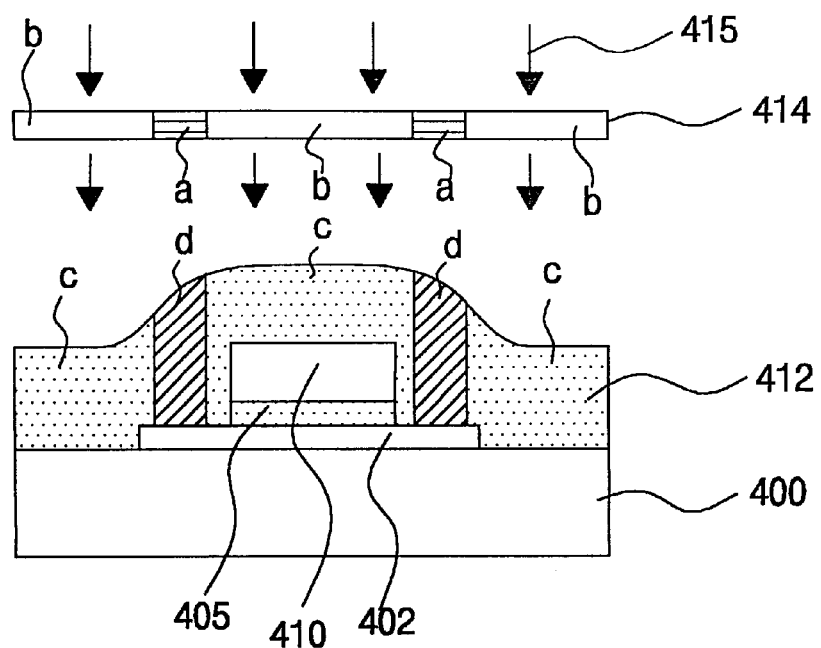

Referring to FIG. 4D, a second mask 414 which has a pattern for forming a ray-penetrating region c and a ray-blocked region d is prepared. The second mask 414 is also patterned for defining a contact hole for source/drain electrodes. Ultraviolet rays are applied to the second organic thin layer 412 while using the second mask 414.

As carried out in the forming the first organic thin layer, the ultraviolet ray irradiation 415 is carried out under an oxygen or atmospheric ambience wherein the ultraviolet rays have a wave length under 210 nm and power over 30 W. During the ultraviolet ray irradiation 415, a second insulating layer is formed on the ray-penetrating region c of the second organic thin layer 412 due to the reciprocal reaction between the oxygen and silicon radicals. In this case, the formation speed of the second insulating layer is accelerated provided that a thermal tratment, which is not shown in the drawing, is utilized together with the ultraviolet ray irradiation 415.

Figure 4E:
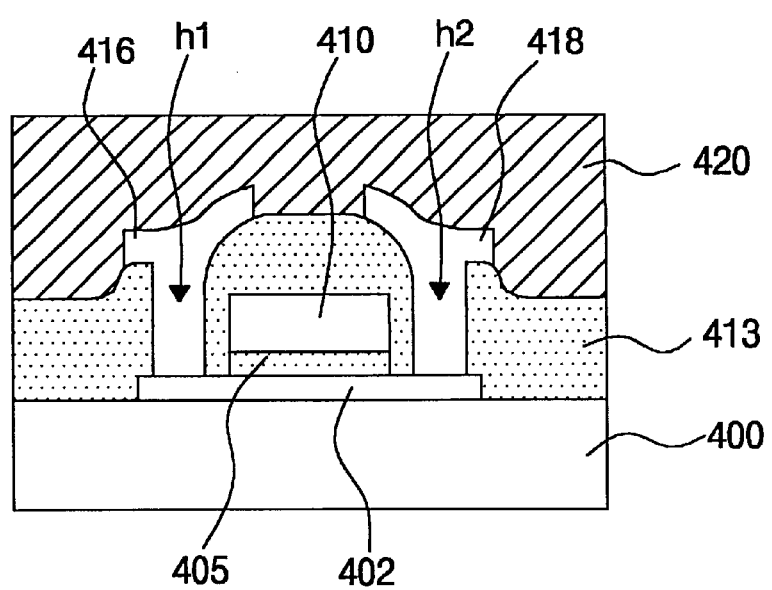

Referring to FIG. 4E, first and second contact holes h1 and h2 which expose the active layer 402 are formed by removing the ray-blocked region d of the second organic thin layer 412. The second insulating layer formed in the ray-penetrating region c of the second organic thin layer 412 is used as an insulating interlayer 413.

After a metal layer covering the above structure has been formed, source and drain electrodes 416 and 418 are formed by patterning the metal layer to fill the first and second contact holes h1 and h2 to be connected with the active layer 402. Then, a third organic thin layer 420 is provided to cover the source/drain electrodes 416 and 418 on the insulating interlayer 413.

Figure 4F:
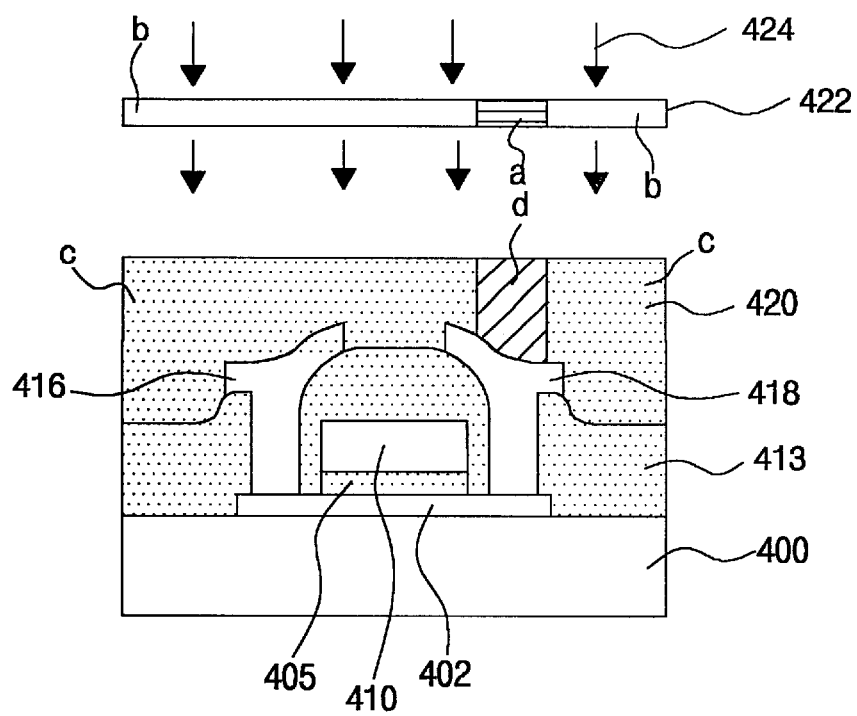

Referring to FIG. 4F, the third organic thin layer 420 is irradiated with ultraviolet rays, using a third mask 422 together with a thermal treatment which is not shown in the drawing.

The third mask 422 has a pattern for forming a ray-penetrating region c and a ray-blocked region d and is also patterned for defining a contact hole connected to the drain electrode 418 in the insulating interlayer 413.

By the energy generated during the ultraviolet ray irradiation 424, a third insulating layer of silicon oxide is formed on the ray-penetrating region c of the third organic thin layer 420 from the reciprocal reaction between oxygen radicals and silicon radicals.

Figure 4G:
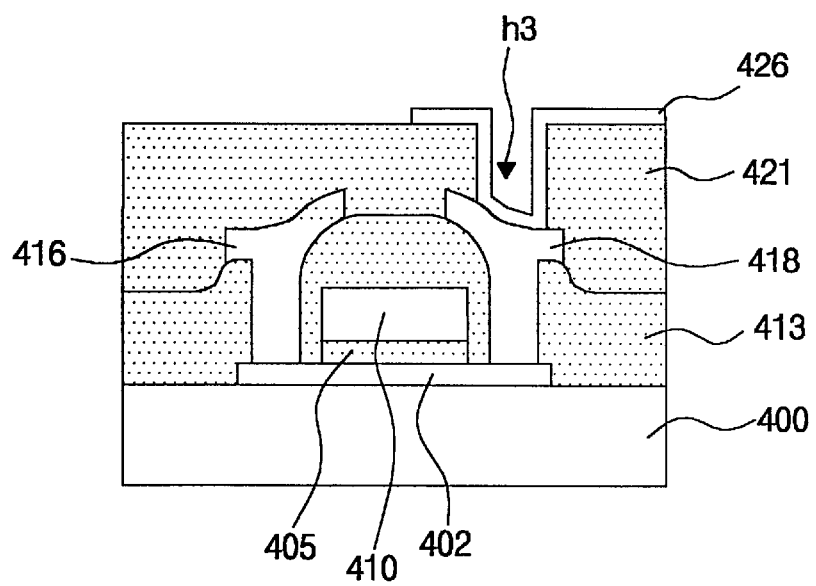

Referring to FIG. 4G, a third contact hole h3 is formed by removing the ray-blocked region d of the third organic thin layer 420. In this case, the third insulating layer on the remaining ray-penetrating region c is used as a passivation layer 421. Then, a pixel electrode 426 is formed by filling the third contact hole h3 on the passivation layer 421.

As mentioned in the above explanation, the present invention establishes an insulating layer pattern on a substrate under low temperature and atmospheric ambience without the use of expensive equipment and complicated processes.

Moreover, the speed of formation of the insulating layer is accelerated provided that a thermal treatment is utilized together with the ultraviolet ray irradiation.

It will be apparent to those skilled in the art that various modifications and variations can be made in the method of forming an insulating layer pattern in liquid crystal display devices according to the present invention without departing from the spirit and scope of the invention. Thus, it is intended that the present invention covers various modifications and variations thereof provided they fall within the scope of the appended claims and equivalents thereof.

What is claimed is:

1. A method of forming an insulating layer pattern, comprising the steps of:
   forming an organic thin layer containing silicon on an insulated substrate;
   exposing the thin layer to a gaseous ambience, including oxygen;
   applying ultraviolet rays to the thin layer using a mask which has a pattern to generate a plurality of oxygen radicals and silicon radicals,
   forming an insulating layer by reacting the silicon radicals with the oxygen radicals; and
   defining an insulating layer pattern by removing a portion of the thin layer free of the ultraviolet rays.

2. The method of forming an insulating layer pattern according to claim 1, wherein the thin layer is a member selected from the group consisting of polysiloxane cinnamate copolymer, polysiloxane cinnamate, poly (dimethylsiloxane), phenyl silane, N-(trimethylsilyl)-benzene, trimethylsilyl acetate, Trimethylsilyl acetate, 1-(trimethylsilyl-methyl)-urea, 1,4-bis(trimethylsilyl)-benzene, and 1,4-bis(trimethylsilyl)-1,3-butadine.

3. The method of forming an insulating layer pattern according to claim 1, wherein the thin layer is formed by a coating method or low temperature deposition method.

4. The method of forming an insulating layer pattern according to claim 1, wherein the ultraviolet rays have energy which is larger than the molecular bond energy of the thin layer.

5. The method of forming an insulating layer pattern according to claim 1, wherein the ultraviolet rays are irradiated with a wavelength under 210 nm and a power over 30 W.

6. The method of forming an insulating layer pattern according to claim 1, wherein a thermal treatment is utilized simultaneously with the ultraviolet ray irradiation.

7. The method of forming an insulating layer pattern according to claim 6, wherein the thermal treatment is carried out by the thermal conduction method of a heating plate.

8. The method of forming an insulating layer pattern according to claim 6, wherein the thermal treatment is carried out by an air-heating method utilizing an IR lamp.

9. A method of forming an insulating layer pattern in a liquid crystal display, comprising the steps of:
   forming an electrode on an insulated substrate;
   forming an organic thin layer on the electrode of the insulated substrate, said organic thin layer containing silicon;
   exposing the thin layer to a gaseous ambience, including oxygen;
   applying ultraviolet rays to the thin layer using a mask having a pattern to generate a plurality of oxygen radicals and silicon radicals,
   forming an insulating layer by reacting the oxygen radicals with the silicon radicals; and
   defining an insulating layer pattern by removing a portion of the thin layer free of the ultraviolet rays.

10. The method of forming an insulating layer pattern in a liquid crystal display according to claim 9, wherein the thin layer is a member selected from the group consisting of polysiloxane cinnamate copolymer, polysiloxane cinnamate, poly(dimethylsiloxane), phenyl silane, N-(trimethylsilyl)-benzene, trimethylsilyl acetate, Trimethylsilyl acetate, 1-(trimethylsilyl-methyl)-urea, 1,4-bis(trimethylsilyl)-benzene, and 1,4-bis(trimethylsilyl)-1,3-butadine.

11. The method of forming an insulating layer pattern in a liquid crystal display according to claim 9, wherein the electrode is a gate electrode.

12. The method of forming an insulating layer pattern in a liquid crystal display according to claim 9, wherein the insulating layer pattern is a gate insulating layer.

13. The method of forming an insulating layer pattern in a liquid crystal display according to claim 9, wherein the thin layer is formed by a coating method or a low temperature deposition method.

14. The method of forming an insulating layer pattern in a liquid crystal display according to claim 9, wherein the ultraviolet rays have energy which is larger than the molecular bond energy of the thin layer.

15. The method of forming an insulating layer pattern in a liquid crystal display according to claim 9, wherein the ultraviolet rays are irradiated with a wavelength under 210 nm and a power over 30 W.

16. The method of forming an insulating layer pattern in a liquid crystal display according to claim 9, wherein a thermal treatment is utilized simultaneously with the ultraviolet ray irradiation.

17. The method of forming an insulating layer pattern in a liquid crystal display according to claim 16, wherein the thermal treatment is carried out by the thermal conduction method of a heating plate.

18. The method of forming an insulating layer pattern in a liquid crystal display according to claim 16, wherein the thermal treatment is carried out by an air-heating method utilizing an IR lamp.

* * * * *